(12) United States Patent
Bergendahl et al.

(10) Patent No.: US 10,438,972 B2
(45) Date of Patent: Oct. 8, 2019

(54) SUB-FIN REMOVAL FOR SOI LIKE ISOLATION WITH UNIFORM ACTIVE FIN HEIGHT

(71) Applicant: International Business Machines Corporation, Armonk, NY (US)

(72) Inventors: Marc A. Bergendahl, Troy, NY (US); Kangguo Cheng, Schenectady, NY (US); Gauri Karve, Cohoes, NY (US); Fee Li Lie, Albany, NY (US); Eric R. Miller, Schenectady, NY (US); John R. Sporre, Albany, NY (US); Sean Teehan, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/263,005

(22) Filed: Sep. 12, 2016

(65) Prior Publication Data

US 2018/0076225 A1    Mar. 15, 2018

(51) Int. Cl.
*H01L 27/12*     (2006.01)
*H01L 21/8234*   (2006.01)
(Continued)

(52) U.S. Cl.
CPC ...... *H01L 27/1207* (2013.01); *H01L 21/3081* (2013.01); *H01L 21/30604* (2013.01); *H01L 21/76224* (2013.01); *H01L 21/823431* (2013.01); *H01L 21/823437* (2013.01); *H01L 21/823481* (2013.01); *H01L 21/845* (2013.01); *H01L 27/0886* (2013.01);
(Continued)

(58) Field of Classification Search
CPC ................ H01L 21/823481; H01L 27/1207
See application file for complete search history.

(56) References Cited

U.S. PATENT DOCUMENTS

| 8,101,486 B2 | 1/2012 | Maszara et al. |
| 8,134,209 B2 | 3/2012 | Yagishita |
| (Continued) | | |

OTHER PUBLICATIONS

Zhou et al., "Fabrication of Bulk Si FinFET using CMOS compatible process," Microelectronic Engineering 94, pp. 26-28 (Jan. 2012).

(Continued)

*Primary Examiner* — Farun Lu
(74) *Attorney, Agent, or Firm* — Vazken Alexanian; Michael J. Chang, LLC

(57) ABSTRACT

Sub-fin removal techniques for SOI like isolation in finFET devices are provided. In one aspect, a method for forming a finFET device includes: etching partial fins in a substrate, wherein the partial fins include top portions of fins of the finFET device; forming a bi-layer spacer on the top portions of the fins; complete etching of the fins in the substrate to form bottom portions of the fins of the finFET device; depositing an insulator between the fins; recessing the insulator enough to expose a region of the fins not covered by the bi-layer spacer; removing the exposed region of the fins to create a gap between the top and bottom portions of the fins; filling the gap with additional insulator. A method for forming a finFET device is also provided where placement of the fin spacer occurs after (rather than before) insulator deposition. A finFET device is also provided.

11 Claims, 10 Drawing Sheets

(51) Int. Cl.
*H01L 21/306* (2006.01)
*H01L 21/308* (2006.01)
*H01L 21/762* (2006.01)
*H01L 29/66* (2006.01)
*H01L 27/088* (2006.01)
*H01L 29/06* (2006.01)
*H01L 21/84* (2006.01)

(52) U.S. Cl.
CPC ...... *H01L 27/1211* (2013.01); *H01L 29/0649* (2013.01); *H01L 29/66545* (2013.01)

(56) References Cited

U.S. PATENT DOCUMENTS

| | | | |
|---|---|---|---|
| 8,293,616 | B2 | 10/2012 | Chang et al. |
| 8,361,869 | B2 | 1/2013 | Zhou et al. |
| 8,455,307 | B2 | 6/2013 | Cho |
| 8,697,522 | B2 | 4/2014 | Cheng et al. |
| 9,166,023 | B2 | 10/2015 | Loubet et al. |
| 9,691,766 | B1 * | 6/2017 | Lin .................. H01L 27/0886 |
| 2012/0193751 | A1 | 8/2012 | Kawasaki et al. |
| 2012/0220093 | A1 | 8/2012 | Zhou et al. |
| 2013/0056802 | A1 | 3/2013 | Cheng et al. |
| 2014/0191321 | A1 * | 7/2014 | Cheng ............... H01L 21/76283 257/347 |
| 2014/0264594 | A1 * | 9/2014 | Adam .................. H01L 29/785 257/347 |
| 2015/0064855 | A1 | 3/2015 | Cheng et al. |
| 2015/0214365 | A1 * | 7/2015 | Xie ..................... H01L 29/7842 257/369 |

OTHER PUBLICATIONS

Xu et al., "High-performance BOI FinFETs based on bulk-silicon substrate," IEEE Transactions on Electron Devices, 55(11), pp. 3246-3250 (Nov. 2008).

Monfray et al., "Localized SOI technology: an innovative Low Cost self-aligned process for Ultra-Thin Si-film on thin BOX integration for Low Power applications," Proc. IEEE International Electron Devices Meeting (IEDM 2007), pp. 693-696 (Dec. 2007).

Cheng et al., "Bottom oxidation through STI (BOTS)—A novel approach to fabricate dielectric isolated FinFETs on bulk substrates," Proc. 2014 Symposium on VLSI Technology, pp. 1-2 (Jun. 2014).

* cited by examiner

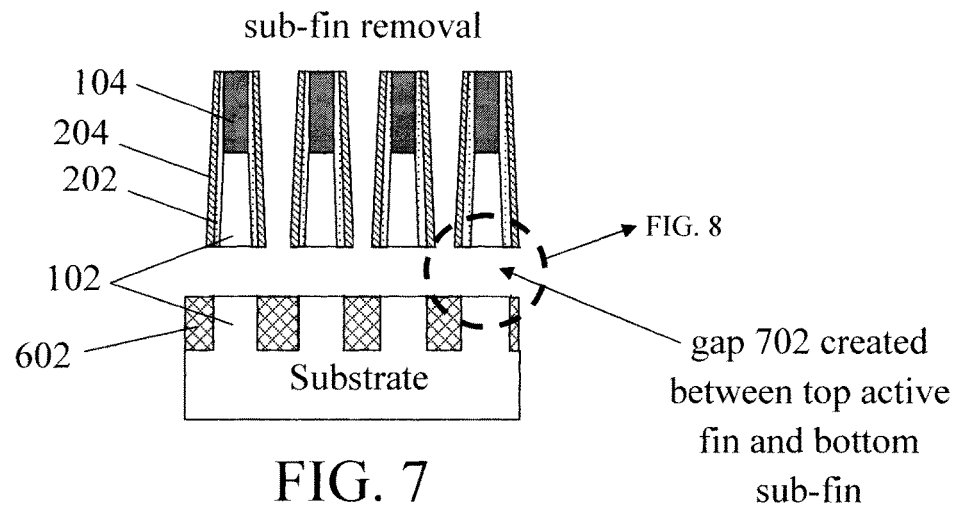
FIG. 7 sub-fin removal — gap 702 created between top active fin and bottom sub-fin
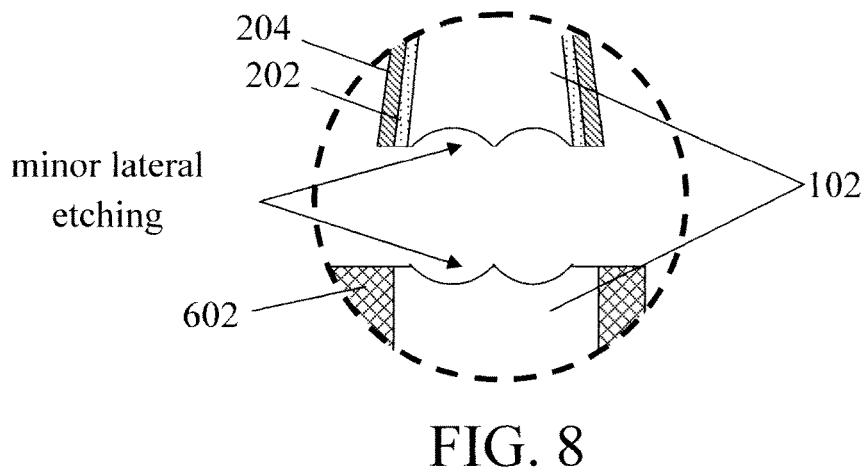
FIG. 8 minor lateral etching
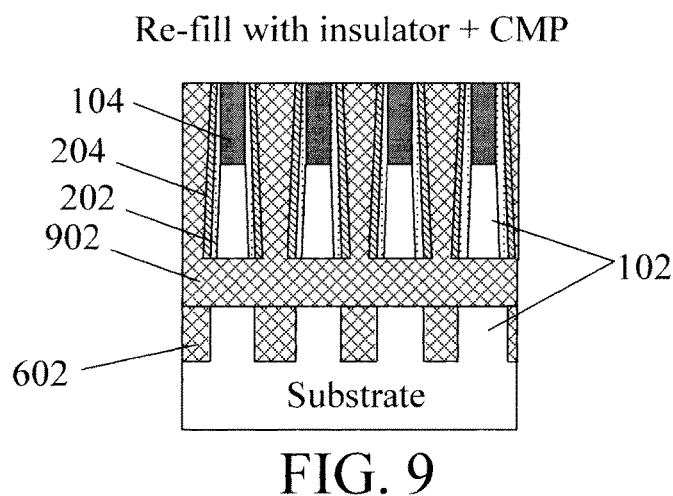
FIG. 9 Re-fill with insulator + CMP Reveal + spacer removal Fin etch (active region)

Insulator deposition, CMP + fin reveal

SUB-FIN REMOVAL FOR SOI LIKE ISOLATION WITH UNIFORM ACTIVE FIN HEIGHT

FIELD OF THE INVENTION

The present invention relates to fin field effect transistor (finFET) devices, and more particularly, to sub-fin removal techniques for silicon-on-insulator (SOI) like isolation in finFET devices.

BACKGROUND OF THE INVENTION

Silicon-on-insulator (SOI) substrates often include a SOI layer over a buried insulator. When the insulator is an oxide, it is also referred to as a buried oxide or BOX. SOI substrates provide an advantage for high speed and low power applications because of the low parasitic capacitance.

As complementary metal oxide semiconductor (CMOS) technology enters the sub-50 nanometer (nm) range, the silicon channel and the buried oxide thicknesses must be less than 50 nm and 100 nm, respectively, in order to prevent the short channel effect (SCE). These requirements, however, present manufacturing problems such as control of Si-SOI layer thickness to within a few percent, precise film electrical properties, and interface characteristics.

Therefore, improved production tools are needed for integrating SOI technology into scaled CMOS devices would be desirable.

SUMMARY OF THE INVENTION

The present invention provides sub-fin removal techniques for silicon-on-insulator (SOI) like isolation in fin field effect transistor (finFET) devices. In one aspect of the invention, a method for forming a finFET device is provided. The method includes: forming a patterned fin hardmask on a substrate; etching partial fins in the substrate using the patterned fin hardmask, wherein the partial fins include top portions of fins of the finFET device; forming a bi-layer spacer on the top portions of the fins; complete etching of the fins in the substrate to form bottom portions of the fins of the finFET device beneath the top portions of the fins; depositing an insulator between the fins; recessing the insulator enough to expose a region of the fins not covered by the bi-layer spacer; removing the exposed region of the fins to create a gap between the top and bottom portions of the fins; filling the gap with additional insulator; forming a gate over a portion of the fins that serves as a channel region of the finFET device; forming gate spacers on opposite sides of the gate; and forming source and drain regions on opposite sides of the gate, offset by the gate spacers.

In another aspect of the invention, another method for forming a finFET device is provided. The method includes: forming a patterned fin hardmask on a substrate; etching fins in the substrate using the patterned fin hardmask; depositing an insulator between the fins; recessing the insulator enough to expose top portions of the fins; depositing a spacer onto the exposed top portions of the fins; further recessing the insulator enough to expose a region of bottom portions of the fins not covered by the spacer; removing the exposed region of the bottom portions of the fins to create a gap between the top and bottom portions of the fins; filling the gap with additional insulator; forming a gate over a portion of the fins that serves as a channel region of the finFET device; forming spacers on opposite sides of the gate; and forming source and drain regions on opposite sides of the gate, offset by the spacers.

In yet another aspect of the invention, a finFET device is provided. The finFET device includes: fins patterned in a substrate; a gap between top portions and bottom portions of the fins; an insulator filling the gap; a gate over a portion of the fins that serves as a channel region of the finFET device; gate spacers on opposite sides of the gate; and source and drain regions on opposite sides of the gate, offset by the gate spacers.

A more complete understanding of the present invention, as well as further features and advantages of the present invention, will be obtained by reference to the following detailed description and drawings.

BRIEF DESCRIPTION OF THE DRAWINGS

FIG. 7 is a cross-sectional diagram illustrating at least a portion of the sub-fin having been removed beneath the active fin creating a gap between the top portion and the bottom portion of each fin according to an embodiment of the present invention;

FIG. 8 is cross-sectional diagram illustrating an enlarged view of one of the fins following the sub-fin removal which shows how minor etching of the exposed surface of the active fin can occur according to an embodiment of the present invention;

FIG. 9 is a cross-sectional diagram illustrating the gap and the spaces between the active fin (from the previous recess) having been filled with an insulator according to an embodiment of the present invention;

DETAILED DESCRIPTION OF PREFERRED EMBODIMENTS

Provided herein are techniques for forming fin field effect transistor (finFET) devices where a bi-layer spacer is used to protect the finFET while the sub-fin (i.e., portion beneath the active fin area) is removed and back-filled with an insulator, thereby creating an SOI-like structure. Advantageously, this method allows for equal active fin area between n-channel finFETs and p-channel finFETs and/or different pitch devices, which is a problem with today's technology. Additionally, certain macros, etc. can use block masks, etc. during sub-fin removal so as to have certain devices SOI-like and others bulk.

Figure 1:
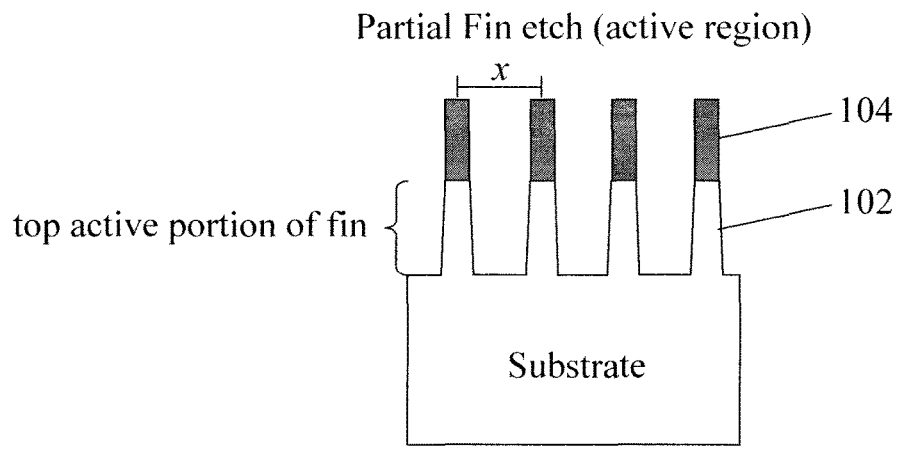
FIG. 1 is a cross-sectional diagram illustrating a fin hardmask having been used to partially etch fins into a bulk semiconductor substrate according to an embodiment of the present invention.

A first exemplary embodiment is now described by way of reference to FIGS. 1-10. Beginning as shown in FIG. 1, a partial fin etch is performed. By partial, it is meant that only a top portion of each fin 102 is formed at this stage. See FIG. 1. Later in the process, the fin etch will be completed by forming the bottom (or sub-fin) portion of each fin. Before the etch is completed, however, a bi-layer spacer is formed protecting the top portion of the fins 102 that will serve as the finFET.

As shown in FIG. 1, the process begins with a bulk semiconductor substrate in which the fins 102 are partially etched. By way of example only, bulk semiconductor substrate 102 can include silicon (Si), strained Si, silicon carbide (SiC), germanium (Ge), silicon germanium (SiGe), silicon-germanium-carbon (SiGeC), Si alloys, Ge alloys, gallium arsenide (GaAs), indium arsenide (InAs), indium phosphide (InP), or any combination thereof.

The fin etch involves forming patterned fin hardmasks 104 on the substrate with the footprint and location of each of the fins. Standard lithography and etching techniques can be employed to pattern the fin hardmasks 104. Suitable hardmask materials include, but are not limited to, nitride hardmask materials such as silicon nitride (SiN). Preferably, an anisotropic etching process such as reactive ion etching (RIE) is used to etch the fins 102 in the substrate. The RIE etch can be endpointed once the top fin portion has been defined. According to an exemplary embodiment, the fins 102 are patterned at a pitch x of from about 25 nanometers (nm) to about 50 nm, and ranges therebetween. See FIG. 1. Fin pitch is the distance from a given point on one fin to the same point on the adjacent fin.

Figure 2:
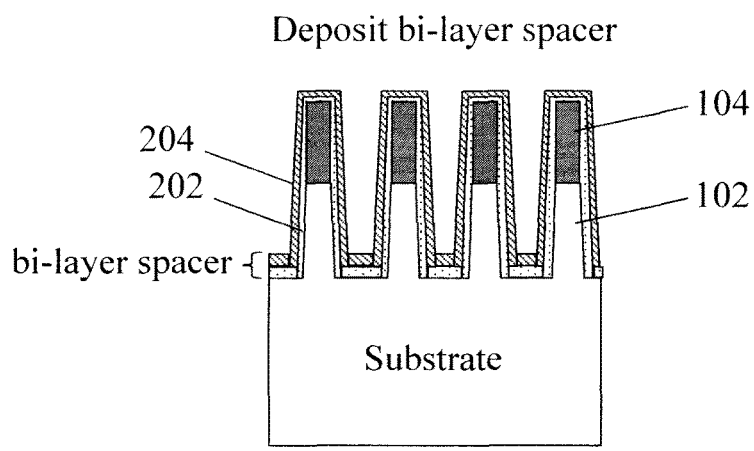
FIG. 2 is a cross-sectional diagram illustrating a bi-layer spacer having been deposited onto the (partial) fins/fin hardmask, and the exposed surfaces of the substrate according to an embodiment of the present invention.

Next, as shown in FIG. 2, a bi-layer spacer is deposited onto the (partial) fins 102/fin hardmask 104, and the exposed surfaces of the substrate. According to an exemplary embodiment, the bi-layer spacer is formed from a combination of oxide spacer and a nitride spacer. Specifically, the bi-layer spacer includes a first spacer 202 and a second spacer 204. In this example, the first spacer 202 is either an oxide (such as silicon dioxide ($SiO_2$)) or a nitride (such as SiN) spacer, and the second spacer 204 also is either an oxide (such as $SiO_2$) or a nitride (such as SiN) spacer but the opposite to that of the first spacer 202. Thus, for instance, when the first spacer 202 is an oxide, the second spacer 204 is a nitride. Conversely, when the first spacer 202 is a nitride, the second spacer 204 is an oxide.

Preferably, a conformal deposition process, such as atomic layer deposition (ALD) or chemical vapor deposition (CVD), is used to deposit the first spacer 202 onto the (partial) fins 102/fin hardmask 104 and the exposed surfaces of the substrate, and then to deposit the second spacer 204 onto the first spacer 202. According to an exemplary embodiment, the first spacer 202 and the second spacer 204 each have a thickness of from about 2 nm to about 5 nm, and ranges therebetween.

Figure 3:
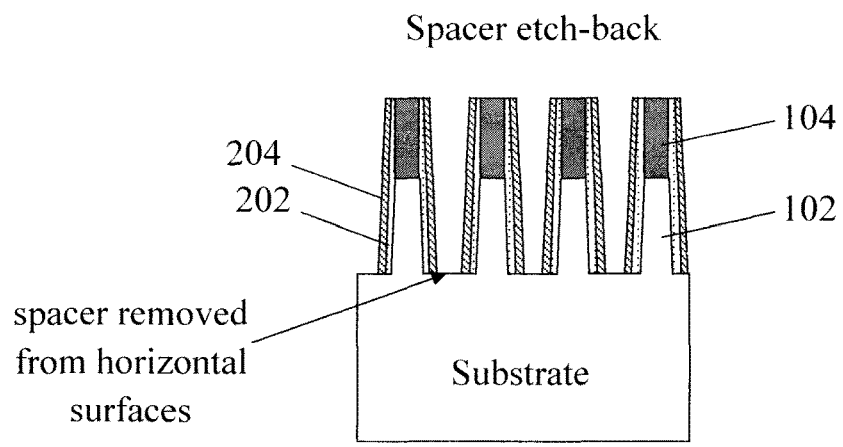
FIG. 3 is a cross-sectional diagram illustrating a spacer etch-back having been performed according to an embodiment of the present invention.
Figure 4:
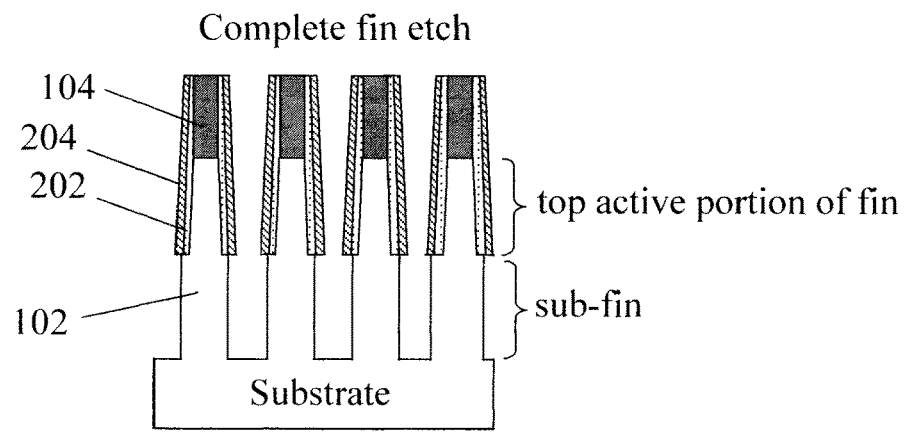
FIG. 4 is a cross-sectional diagram illustrating the fin etch having been completed according to an embodiment of the present invention.
Figure 5:
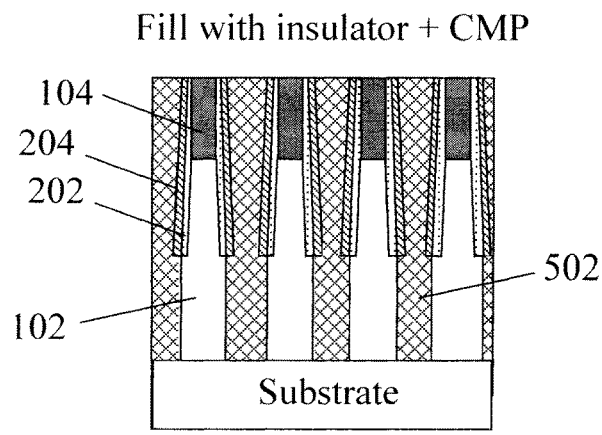
FIG. 5 is a cross-sectional diagram illustrating an insulator having been deposited in between the fins, filling the spaces in between the fins according to an embodiment of the present invention.

With the bi-layer spacer in place, the next task is to complete the fin etch. To do so, the bi-layer spacer needs to be removed from the surfaces of the substrate between the fins 102. See FIG. 3. As shown in FIG. 3, this spacer etch-back step also removes the bi-layer spacer from the horizontal surfaces of the fin hardmasks 104. The fin hardmasks 104, however, remain in place to protect the fins. An anisotropic etch such as RIE is ideal for this selective etch-back as it will leave the bi-layer spacer intact on vertical surfaces. A combination of etch steps may be needed to fully etch-back both layers of the bi-layer spacer. For instance, an oxide-selective RIE followed by a nitride-selective RIE may be employed to etch an oxide first spacer 202 and nitride second spacer 204 bi-layer.

After spacer etch-back, the fin etch is then completed. See FIG. 4. In the same manner as described above, the fin hardmasks 104 are used to etch the sub-fin portion of each fin 102. Thus, at this point in the process each fin 102 includes a top (active fin) portion which is protected by the bi-layer spacer, and a bottom (sub-fin) portion which does not contain any spacer. As above, an anisotropic etch such as RIE is well suited for the fin etch.

Following completion of the fin etch, an insulator 502 is deposited in between the fins 102, filling the spaces in between the fins 102. See FIG. 5. Suitable insulators include, but are not limited to shallow trench isolation (STI) oxides, such as $SiO_2$. Any insulator overfill is polished back using a process such as chemical mechanical polishing (CMP).

Figure 6:
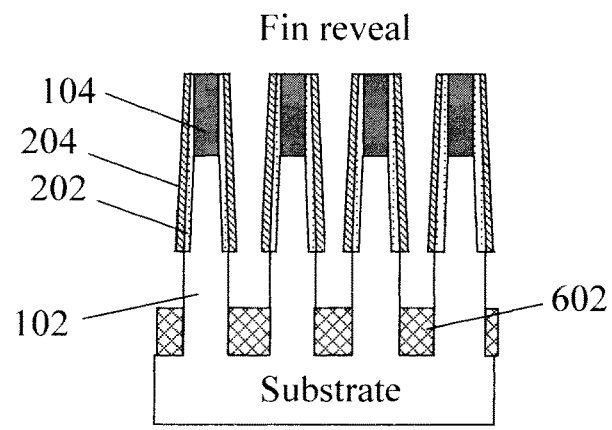
FIG. 6 is a cross-sectional diagram illustrating the insulator having been recessed to reveal the fins, leaving only a portion of the insulator between the sub-fin portion of the fins according to an embodiment of the present invention.

The insulator 502 is then recessed to reveal the fins 102. See FIG. 6. The recess is enough such that a region of the sub-fin is exposed. Specifically, as shown in FIG. 6, following recess of the insulator 502 only a portion 602 of the insulator remains between the sub-fin portion of the fins 102 such that a region of the sub-fin remains exposed beneath the bi-layer spacer. It is this exposed region of the sub-fin that will next be removed (see below). The top (active fin) portion remains protected by the bi-layer spacer. Recessing of the insulator 502 can be accomplished using a selective etching process that is end pointed when only the portion 602 of the insulator remains between the sub-fin portion of the fins 102. By way of example only, when the insulator 502 is an oxide, an oxide-selective RIE is well suited for the recess etch. It is notable that consideration should be given to the choice of spacer and insulator materials used in the process. For instance, when the insulator 502 is an oxide, then it is preferable that the outer spacer of the bi-layer is a material that permits selective etching of the insulator relative to the spacer. In that case, for example, the first spacer 202 can be an oxide and the second spacer 204 a nitride. Therefore, the second spacer 204 (the outer spacer) protects the first spacer 202 (the inner spacer) during the insulator 502 oxide-selective recess etch.

Recessing of the insulator 502 permits access to, and removal of, at least a portion of the sub-fin beneath the active fin which effectively creates a gap 702 between the top portion and the bottom portion of each fin. See FIG. 7. According to an exemplary embodiment, gap 702 is created using a fin-selective etching process. To gain access to this region, an isotropic etching process is preferably employed, such as a fin-selective wet etching process. However, since the top (active fin) portion is largely protected by the bi-layer spacer, a non-directional etch will only cause minor etching at the exposed ends of the active fin. See, for example, FIG. 8 which provides an enlarged view of one of the fins 102 following the sub-fin removal. As shown in FIG. 8, minor lateral etching of the (bottom) exposed surface of the active fin occurs.

Referring back to FIG. 7, in this example portion 602 of the recessed insulator (see description of FIG. 6, above) remains at a base of the sub-fin, and protects the bulk of the substrate during the sub-fin etch. It is notable that the ends of the fins (not visible in this depiction) remain anchored to the substrate (i.e., along an axis perpendicular to the cross-sectional cut shown in FIG. 7 that runs into/out of the page). Anchoring the fins provides structural support during the sub-fin etch. As will be described in detail below, a block mask can be used to selectively process a portion of the device and/or certain devices selective to other (e.g., bulk) devices.

Following the sub-fin etch, the gap 702 and the spaces between the active fin (from the previous recess) are filled with an insulator 902. See FIG. 9. Any overfill of the insulator 902 is then removed using a process such as CMP. The same insulator can be used as insulator 502, however that is not a requirement. For instance, insulator 502 and insulator 902 can be the same STI oxide, e.g., $SiO_2$.

Figure 10:
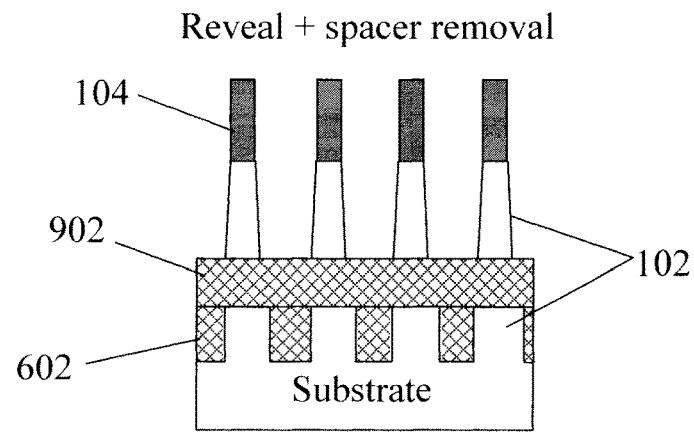
FIG. 10 is a cross-sectional diagram illustrating the active fin having been revealed, and the bi-layer spacer having been removed according to an embodiment of the present invention.

Finally, the insulator 902 is recessed to reveal the active fin, and the bi-layer spacer is removed. See FIG. 10. As shown in FIG. 10, the recess etch is endpointed at the bottom of the active fin, such that the insulator 902 remains intact beneath the active fin, and separates the active fin from the remaining portions of the sub-fin/the substrate. This is thus like an SOI configuration where the buried insulator (in this case the insulator 902) separates the active SOI (in this case the active fin) from the underlying substrate. The bi-layer spacer can be removed in one or more (e.g., oxide/nitride) selective, or non-selective etching steps. The fins hardmask may also be removed, if so desired, or left in place to protect the fins during subsequent processing.

Depending on the final device, further processing may be carried out to form gate, source, drain, etc. structures to the active fin. See, for instance, the example provided below.

An alternative process flow is also provided herein where placement of the fin spacer occurs after (rather than before) insulator deposition. To do so, a full fin etch is initially performed, followed by placement of the spacer over the active fin. See, for example, FIGS. 11-18.

Figure 11:
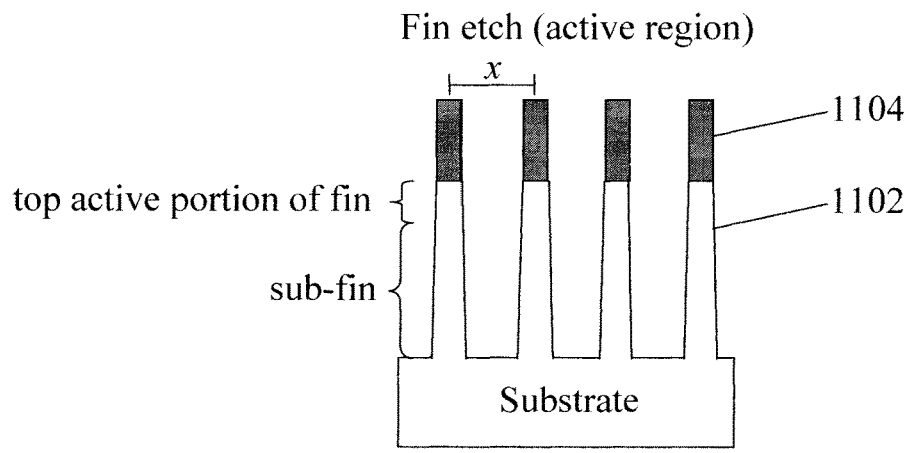
FIG. 11 is a cross-sectional diagram illustrating, according to an alternative embodiment, fin hardmasks having been used to pattern fins in a substrate according to an embodiment of the present invention.

Specifically, as shown in FIG. 11 the process begins with fins 1102 having been patterned in a substrate. As described above, suitable substrate materials include, but are not limited to, Si, strained Si, SiC, Ge, SiGe, SiGeC, Si alloys, Ge alloys, GaAs, InAs, InP, or any combination thereof. As also described above, the fin etch involves forming patterned fin hardmasks 1104 on the substrate with the footprint and location of each of the fins, and an etching process such as RIE is used to etch the fins 1102 in the substrate. Suitable fin hardmask materials include, but are not limited to, SiN. According to an exemplary embodiment, the fins 1102 are patterned at a pitch x of from about 25 nm to about 50 nm, and ranges therebetween. In the same manner as above, the fins will each contain a top active finFET portion and a bottom sub-fin (see FIG. 11), and it is the sub-fin that will be removed and filled with an insulator to achieve SOI-like active fin isolation.

Figure 12:
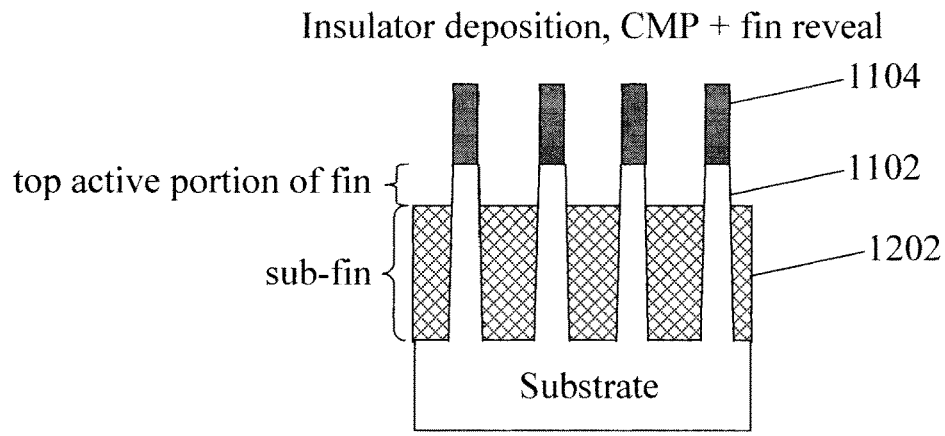
FIG. 12 is a cross-sectional diagram illustrating an insulator having been deposited in between the fins, and then having been recessed to reveal the fins according to an embodiment of the present invention.
Figure 13:
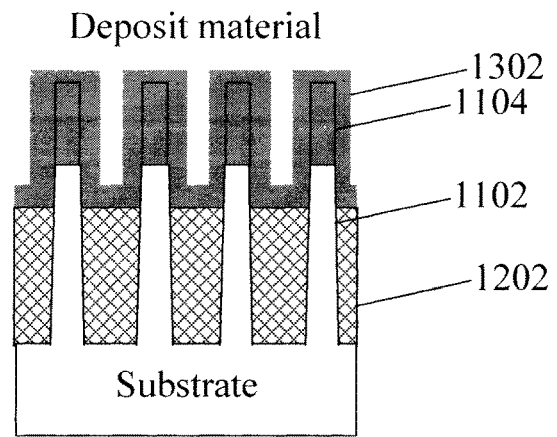
FIG. 13 is a cross-sectional diagram illustrating a spacer having been deposited onto the exposed top (active fin) portions of fins/fin hardmasks according to an embodiment of the present invention.

Specifically, as shown in FIG. 12, an insulator 1202 (e.g., an STI oxide such as $SiO_2$) is deposited in between the fins 1102, filling the spaces in between the fins 1102 and, in the same manner as described above, is then recessed (via a recess etch) enough to reveal the top active portion of the fins 1102. After deposition of the insulator 1202 (but before the recess etch) any insulator overfill is polished back using, e.g., CMP.

The fin reveal exposes the top (active fin) portions of fins 1102. See FIG. 12. As shown in FIG. 12, the insulator 1202 that remains after the recess etch is present between the bottom (sub-fin) portions of fins 1102.

A spacer 1302 is then deposited onto the exposed top (active fin) portions of fins 1102/fin hardmasks 1104. See FIG. 13. This spacer 1302 will serve to protect the top (active fin) portions of fins 1102 during the subsequent sub-fin etch (see below). As provided above, suitable spacer materials include, but are not limited to, oxide (such as $SiO_2$) and nitride (such as SiN) spacer materials. According to an exemplary embodiment, the spacer 1302 is a nitride spacer and is formed from the same material as the fin hardmasks 1104 (e.g., SiN).

Preferably, a conformal deposition process, such as ALD or CVD, is used to deposit the spacer 1302. According to an exemplary embodiment, spacer 1302 has a thickness of from about 2 nm to about 5 nm, and ranges therebetween.

Figure 14:
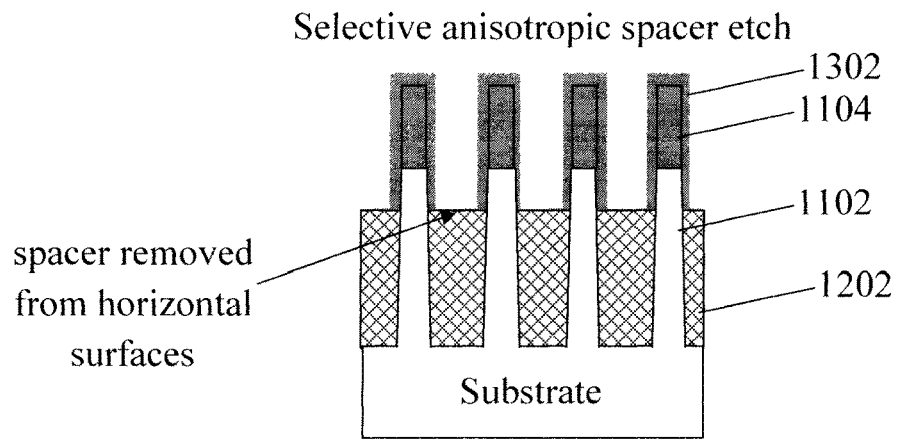
FIG. 14 is a cross-sectional diagram illustrating a spacer etch-back having been performed according to an embodiment of the present invention.
Figure 15:
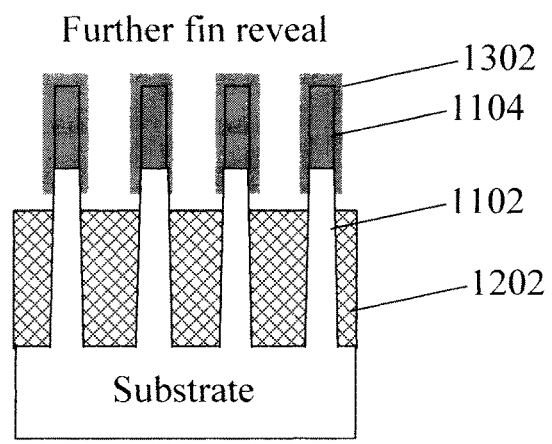
FIG. 15 is a cross-sectional diagram illustrating the recess of the insulator having been extended to reveal a portion of the sub-fin according to an embodiment of the present invention.

In order to gain access to the sub-fin, a spacer etch-back is next performed. See FIG. 14. As shown in FIG. 14, the spacer etch is configured to selectively remove the spacer 1302 from the surfaces of the insulator 1202 between the fins 1102. An anisotropic etch such as RIE is ideal for this selective spacer etch-back as it will leave the spacer 1302 intact on vertical surfaces, thereby protecting the sidewalls of the active fin. When, for example, the spacer 1302 is a nitride (e.g., SiN) spacer, a nitride-selective RIE will open up the spacer 1302, while leaving the insulator (e.g., an STI oxide) intact.

Now with access to the underlying insulator 1202 and protection of the top (active fin) portion of the fins 1102 by the spacer 1302, the recess of the insulator 1202 can be further extended enough to reveal a region of the sub-fin (not covered by the spacer 1302). See FIG. 15. The details of the recess etch for the insulator 1202 were provided above. Next, at least a portion (i.e., the exposed region) of the sub-fin is removed from beneath the active fin which effectively creates a gap 1602 between the top portion and the bottom portion of each fin 1102. See FIG. 16. To gain access to this region, an isotropic (fin-selective) etching process is preferably employed, such as a selective wet etching process. The fin hardmasks 1104 and spacer 1302 protect the top and sidewalls of the top active fin. Thus, only minor etching at the exposed ends of the active fin (opposite the sub-fin) occurs. This minor lateral etching is the same as that depicted in FIG. 8—described above.

Figure 16:
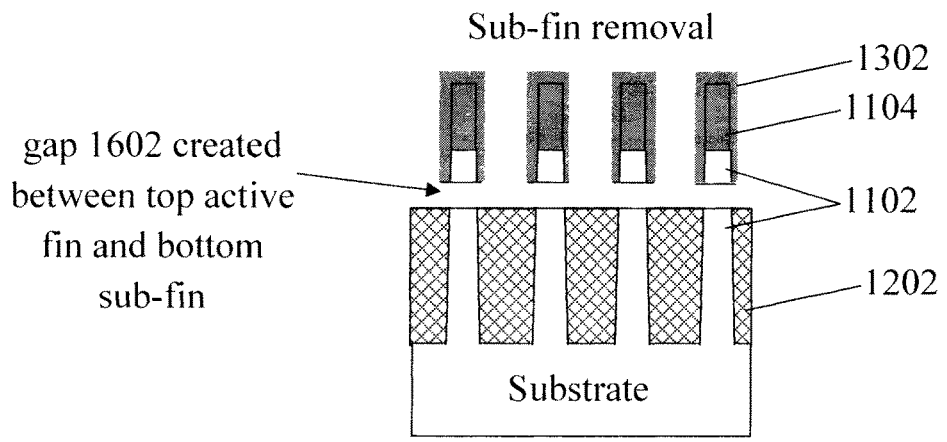
FIG. 16 is a cross-sectional diagram illustrating at least a portion of the sub-fin having been removed from beneath the active fin creating a gap between the top portion and the bottom portion of each fin according to an embodiment of the present invention.
Figure 17:
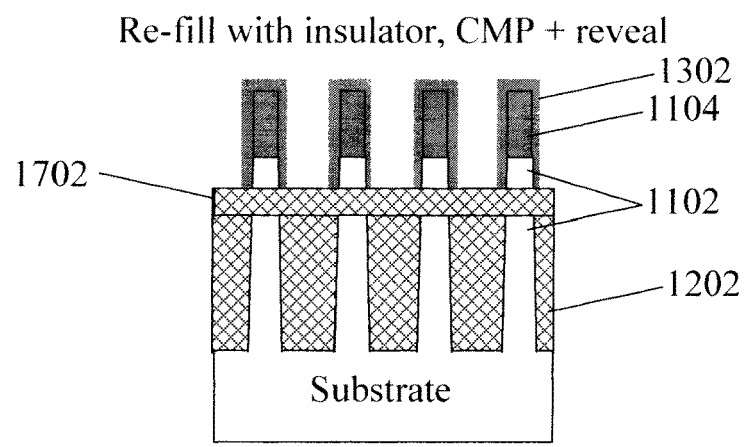
FIG. 17 is a cross-sectional diagram illustrating the gap and the spaces between the active fin having been filled with an insulator which is then recessed to reveal the active fin according to an embodiment of the present invention.
Figure 18:
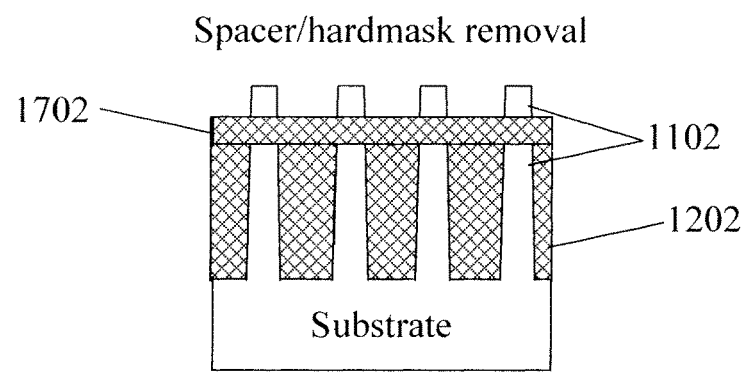
FIG. 18 is a cross-sectional diagram illustrating the fin hardmask and spacer having been removed according to an embodiment of the present invention.

It is notable that the ends of the fins (not visible in this depiction) remain anchored to the substrate (i.e., along an axis perpendicular to the cross-sectional cut shown in FIG. 16 that runs into/out of the page). Anchoring the fins provides structural support during the sub-fin etch. As will be described in detail below, a block mask can be used to selectively process a portion of the device and/or certain devices selective to other (e.g., bulk) devices.

Following the sub-fin etch, the gap 1602 and the spaces between the active fin (from the previous recess) are filled with an insulator 1702. See FIG. 17. By way of example only, the same insulator can be used as insulator 1202. For instance, insulator 1702 and insulator 1202 can be the same STI oxide, e.g., $SiO_2$. Any overfill of the insulator 1702 is then removed using a process such as CMP. A recess etch is then performed (in the same manner described above) to reveal the active fin.

Finally, the hardmask 1104 and spacer 1302 are removed. By way of example only, when the hardmask 1104 and spacer 1302 are a nitride material, e.g., SiN, they can be removed using a nitride-selective etch. Depending on the final device, further processing may be carried out to form gate, source, drain, etc. structures to the active fin.

Figure 19:
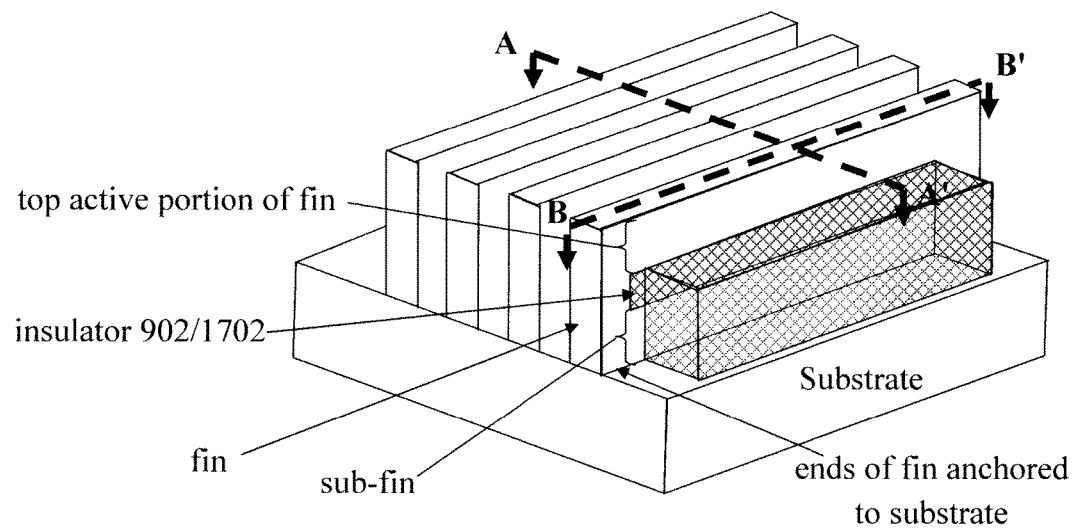
FIG. 19 is a three-dimensional diagram illustrating how the ends of the fins remain intact and anchored to the substrate according to an embodiment of the present invention.

For example, switching now to a three dimensional representation in FIG. 19, it is illustrated how the ends of the fins remain intact and anchored to the substrate which, as described above, provides structural support for the sub-fin removal and insulator fill in the active area. As will be described in detail below, a block mask can be used to selectively process a portion (e.g., the active area) of the device and/or certain devices selective to other (e.g., bulk, non-SOI) devices. The fins shown illustrated in FIG. 19 are representative of the SOI-isolated fins produced by either of the above exemplary process flows. The cross-sectional depictions in the preceding figures illustrate a cut through, e.g., line A-A' in FIG. 19.

To fabricate a finFET device, a gate will be formed over the fins, and source and drain regions will be formed on opposite sides of the gate. In the following example, a gate-last approach is employed. With a gate-last process, a placeholder dummy gate is initially formed over the channel region of the device. Source and drain region processing is then performed, after which the dummy gate is removed and replaced with the final or replacement gate stack of the device. A gate-last approach is beneficial as it protects the replacement gate stack materials from potentially damaging processing conditions (such as elevated temperatures) used in forming the source and drain regions, since the replacement gate stack materials are not placed until the end of the process.

Figure 20:
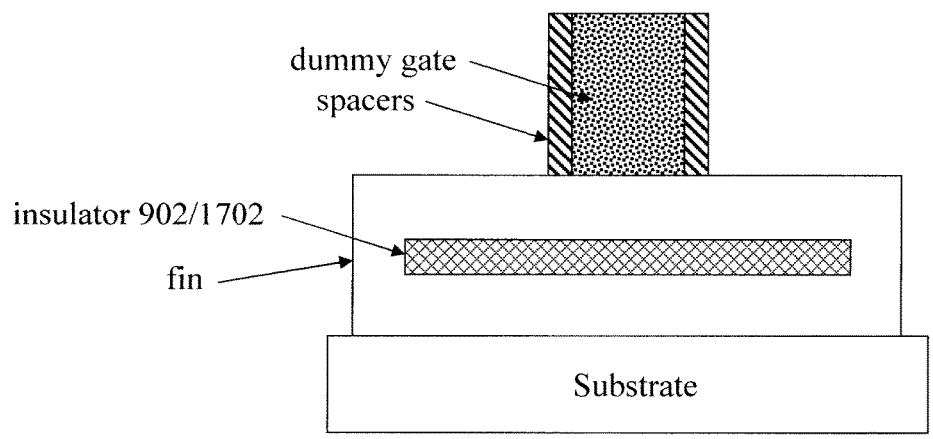
FIG. 20 is a cross-sectional diagram illustrating at least one dummy gate having been formed over the fins and spacers having been formed on opposite sides of the dummy gate according to an embodiment of the present invention.

Switching back to a cross-sectional view, but now through line B-B' of FIG. 19, as shown in FIG. 20 the gate formation process begins with at least one dummy gate being formed over the fins. The dummy gate is formed over a portion of each of the fins that will serve as a channel region of the finFET device. The portions of the fins extending out from either side of the dummy gate will serve as the source and drain regions of the finFET device. See below. Prior to forming the dummy gate, a dummy gate oxide (not shown) such as $SiO_2$ is preferably formed on the fins which will act as a stopping layer and protects the fins during the dummy gate removal later on in the process.

The dummy gate is formed by first blanket depositing a suitable dummy gate material over the fins, and then patterning the dummy gate material into at least one individual dummy gate. Suitable dummy gate materials include, but are not limited to, poly-silicon (poly-Si) and amorphous silicon. Standard lithography and etching techniques may be employed to pattern the dummy gates.

Spacers are preferably formed on opposite sides of the dummy gate. See FIG. 20. The spacers will serve to offset the gate from what will be the source and drain regions of the finFET device.

Figure 21:
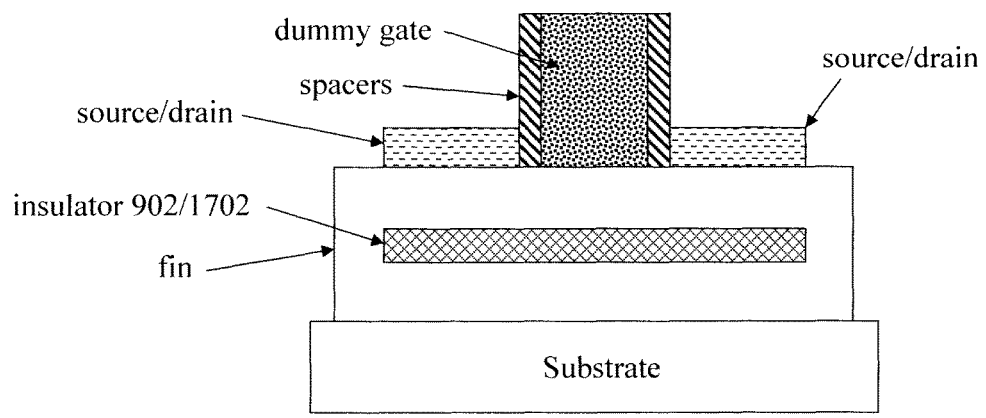
FIG. 21 is a cross-sectional diagram illustrating doped source and drain regions having been formed on opposite sides of the dummy gate, offset by the spacers according to an embodiment of the present invention.

Next, doped source and drain regions are formed on opposite sides of the dummy gate, offset by the spacers. See FIG. 21. According to an exemplary embodiment, the doped source and drain regions are formed from an in-situ doped epitaxial material such as in-situ doped epitaxial Si. Suitable n-type dopants include but are not limited to phosphorous (P), and suitable p-type dopants include but are not limited to boron (B). The use of an in-situ doping process is merely an example, and one may instead employ an ex-situ process such as ion implantation to introduce dopants into the source and drain regions of the device.

Figure 22:
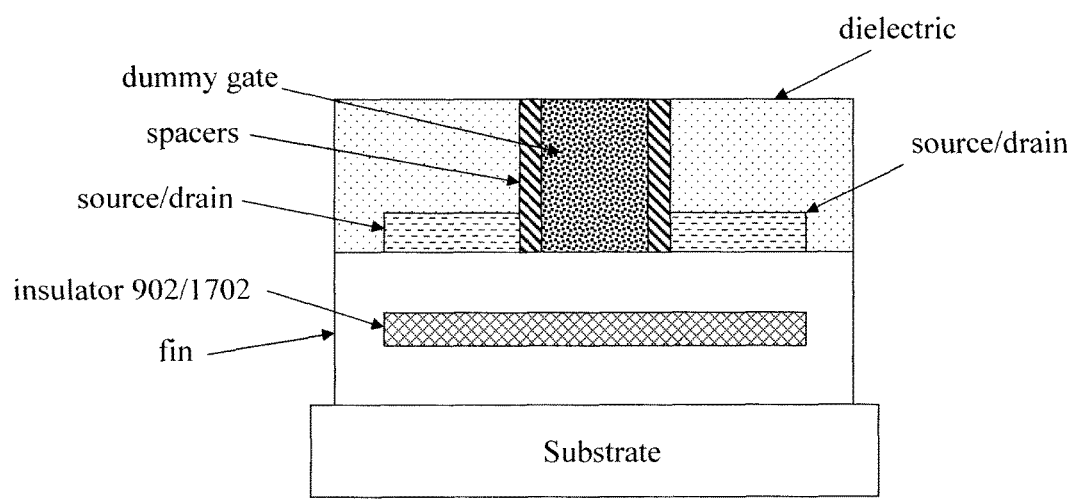
FIG. 22 is a cross-sectional diagram illustrating the dummy gate having been buried in a dielectric material according to an embodiment of the present invention.

In order to permit removal and replacement of the dummy gate, a dielectric material is next deposited covering the dummy gates. See FIG. 22. As shown in FIG. 22, the dielectric material is polished (using, e.g., CMP) to expose a top surface of the dummy gate. This enables the dummy gate to be removed selective to the dielectric material.

Figure 23:
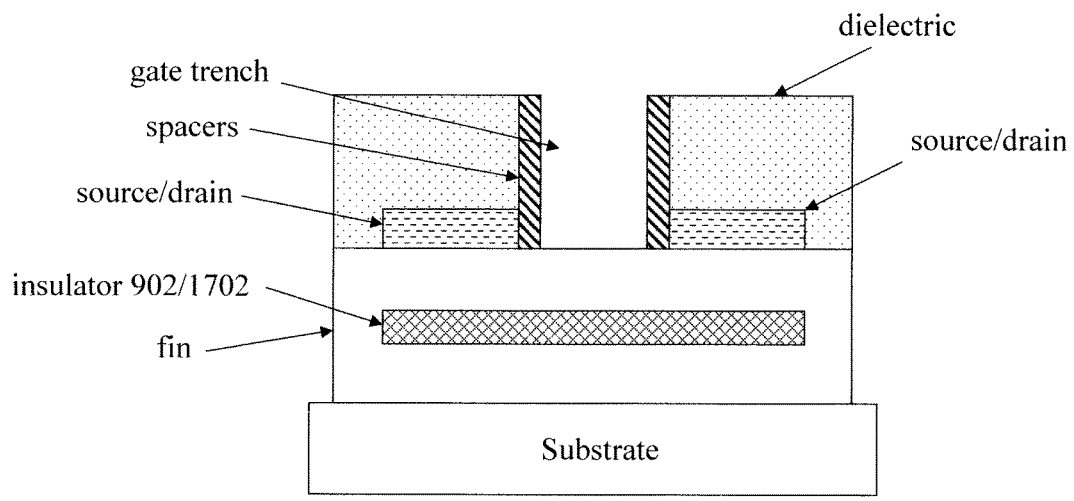
FIG. 23 is a cross-sectional diagram illustrating the dummy gate having been removed selective to the spacers and dielectric material, forming a gate trench in the dielectric material according to an embodiment of the present invention.

The dummy gate is then removed selective to the dielectric material/the spacers, forming a trench in the dielectric material over the portion of the fins that serve as the channel region of the device. See FIG. 23. The replacement gate will be formed in this trench, thus the trench is also referred to herein as a "gate trench." A dummy gate-selective (e.g., poly-Si or amorphous silicon-selective) etch is used to remove the dummy gate.

Figure 24:
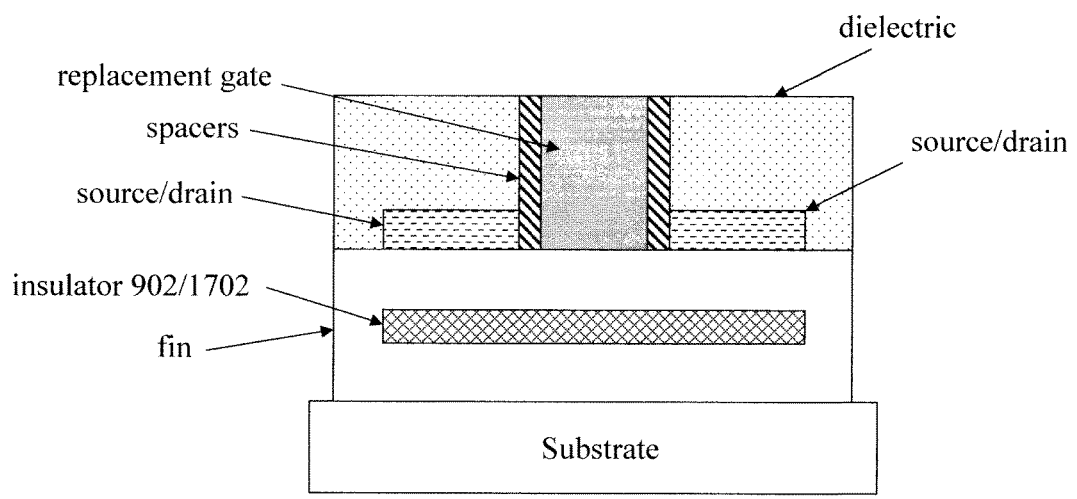
FIG. 24 is a cross-sectional diagram illustrating a replacement gate having been formed in the gate trench according to an embodiment of the present invention.

Finally, a replacement gate is formed in the gate trench over the portion of the fins that serve as the channel region of the device. See FIG. 24. According to an exemplary embodiment, the replacement gate is a metal gate. Prior to placing the replacement gate, a gate dielectric (not shown) is preferably formed on the fins, separating the fins from the replacement gate. For a metal gate, suitable gate dielectrics include, but are not limited to, high-κ materials such as hafnium oxide ($HfO_2$) and lanthanum oxide ($La_2O_3$). The term "high-κ" as used herein refers to a material having a relative dielectric constant κ which is much higher than that of silicon dioxide (e.g., a dielectric constant κ=25 for hafnium oxide rather than 4 for silicon dioxide).

To form the replacement gate, a gate metal or combination of metals is/are deposited into the gate trench on the gate dielectric. By way of example only, in the case of a metal gate, a combination of gate metals may be used. For instance, a workfunction setting metal layer may be deposited onto the gate dielectric, followed by a filler metal layer. Suitable workfunction setting metals include, but are not limited to, n-type workfunction setting metals such as titanium nitride (TiN) and tantalum nitride (TaN), and p-type workfunction setting metals such as tungsten (W). Suitable filler metals include, but are not limited to, aluminum (Al).

Figure 25:
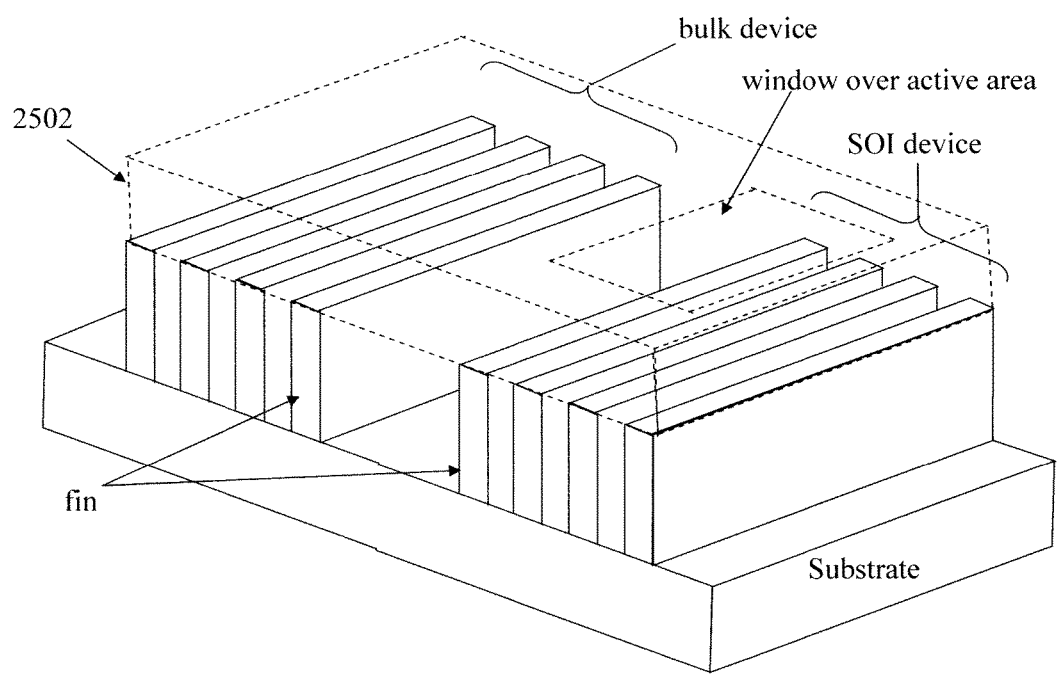
FIG. 25 is a three-dimensional diagram illustrating a block mask having been placed to permit selective processing of a portion (e.g., the active area) of the device and/or certain devices selective to other (e.g., bulk, non-SOI) devices according to an embodiment of the present invention.

As highlighted above, a block mask can be used to selectively process a portion (e.g., the active area) of the device and/or certain devices selective to other (e.g., bulk, non-SOI) devices. See, for example, FIG. 25. As shown in FIG. 25, a block mask 2502 enables selective processing (i.e., as described in accordance with the description of FIGS. 1-10 and/or FIGS. 11-18, above) of a particular region (i.e., an active area) of a (SOI) device and/or selective processing of an SOI device(s) (i.e., as described in accordance with the description of FIGS. 1-10 and/or 11-18, above) relative to other (bulk) devices. Specifically, as shown in FIG. 25 the block mask 2502 completely covers what will be a bulk finFET device(s) (i.e., fins formed in the bulk substrate that will not be subject to the above-described SOI-like isolation process). There is a window in the block mask 2502 over the active area of an SOI finFET device(s). Namely, the process described in accordance with the description of FIGS. 1-10 and/or FIGS. 11-18, above, will be preformed through the window. By way of example only, with reference to the exemplary process flow illustrated in FIGS. 1-10 the block mask 2502 may be placed after completion of the fin etch (i.e., after the fin etch illustrated in FIG. 4, but before the insulator fill illustrated in FIG. 5). With reference to the exemplary process flow illustrated in FIGS. 11-18 the block mask 2502 may be placed after the initial fin etch (i.e., after the fin etch illustrated in FIG. 11, but before the insulator deposition illustrated in FIG. 12).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a fin field effect transistor (finFET) device, the method comprising:
   forming a patterned fin hardmask on a substrate;
   etching partial fins in the substrate using the patterned fin hardmask, wherein the partial fins comprise top portions of fins of the finFET device;
   forming a bi-layer spacer on the top portions of the fins and on surfaces of the substrate in between the top portions of the fins, wherein the bi-layer spacer comprises i) a first spacer on the top portion of the fins and on the surfaces of the substrate in between the top portions of the fins, and ii) a second spacer on the first spacer, and wherein the first spacer and the second spacer each have a thickness of from about 2 nanometers to about 5 nanometers, and ranges therebetween;
   selectively removing the bi-layer spacer from the surfaces of the substrate in between the top portions of the fins;
   complete etching of the fins in the substrate, after the bi-layer spacer has been selectively removed from the surfaces of the substrate in between the top portions of the fins, to form bottom portions of the fins of the finFET device beneath the top portions of the fins;
   depositing an insulator between the fins;
   recessing the insulator enough to expose a region of the fins not covered by the bi-layer spacer, wherein the patterned fin hardmask is present on the fins during the recessing;
   removing the exposed region of the fins to create a gap between the top and bottom portions of the fins;
   filling the gap with additional insulator;
   forming a gate over a portion of the fins that serves as a channel region of the finFET device;
   forming gate spacers on opposite sides of the gate; and
   forming source and drain regions on opposite sides of the gate, offset by the gate spacers.

2. The method of claim 1, wherein the substrate is a bulk semiconductor substrate comprising a material selected from the group consisting of: silicon, strained silicon, silicon carbide, germanium, silicon germanium, silicon-germanium-carbon, silicon alloys, germanium alloys, gallium arsenide, indium arsenide, indium phosphide, and combinations thereof.

3. The method of claim 1, wherein the fins have a pitch of from about 25 nanometers to about 50 nanometers, and ranges therebetween.

4. The method of claim 1, wherein the first spacer comprises an oxide spacer and the second spacer comprises a nitride spacer.

5. The method of claim 1, wherein the insulator comprises an oxide.

6. The method of claim 1, wherein following the recessing of the insulator a portion of the insulator remains between the bottom portions of the fins.

7. The method of claim 1, wherein the exposed region of the fins are removed using an isotropic etching process.

8. The method of claim 1, further comprising:
   depositing the additional insulator so as to fill the gap and spaces between the fins; and
   recessing the additional insulator to reveal the top portions of the fins.

9. The method of claim 1, further comprising:
   removing the bi-layer spacer.

10. The method of claim 1, further comprising:
    forming a dummy gate over the portion of the fins that serves as the channel region of the finFET device;
    forming the gate spacers on opposite sides of the dummy gate;
    forming the source and drain regions on opposite sides of the dummy gate, offset by the gate spacers;
    depositing a dielectric over the dummy gate;
    removing the dummy gate selective to the dielectric to form a gate trench in the dielectric; and
    forming the gate in the gate trench.

11. A finFET device, comprising:
    fins patterned in a semiconductor substrate;
    a gap between top portions and bottom portions of the fins in an active area of the finFET device, wherein the fins are intact on opposite ends of the active area to anchor the fins to the semiconductor substrate, wherein lateral etching of the top portions and the bottom portions of the fins is present within the gap, and wherein the lateral etching is absent from sidewalls of the fins;

an insulator filling the gap;

another insulator between the bottom portions of the fins that is coplanar with a bottom of the gap;

a gate over a portion of the fins that serves as a channel region of the finFET device;

gate spacers on opposite sides of the gate; and source and drain regions on opposite sides of the gate, offset by the gate spacers.

* * * * *